(12) United States Patent
Huott et al.

(10) Patent No.: US 9,762,213 B1
(45) Date of Patent: *Sep. 12, 2017

(54) INITIALIZING SCANNABLE AND NON-SCANNABLE LATCHES FROM A COMMON CLOCK BUFFER

(71) Applicant: INTERNATIONAL BUSINESS MACHINES CORPORATION, Armonk, NY (US)

(72) Inventors: William V. Huott, Holmes, NY (US); Ricardo H. Nigaglioni, Austin, TX (US); Hagen Schmidt, Tuebingen (DE); James D. Warnock, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/440,205

(22) Filed: Feb. 23, 2017

Related U.S. Application Data

(63) Continuation of application No. 15/245,896, filed on Aug. 24, 2016.

(51) Int. Cl.
| | |
|---|---|
| *H03K 3/289* | (2006.01) |
| *H03K 3/037* | (2006.01) |
| *H03K 19/20* | (2006.01) |
| *G06F 13/42* | (2006.01) |
| *G06F 13/16* | (2006.01) |

(52) U.S. Cl.
CPC ....... *H03K 3/0372* (2013.01); *G06F 13/1673* (2013.01); *G06F 13/4243* (2013.01); *H03K 19/20* (2013.01)

(58) Field of Classification Search
None
See application file for complete search history.

(56) References Cited

U.S. PATENT DOCUMENTS

2005/0125753 A1* 6/2005 Vandling ........ G01R 31/318307
716/103
2014/0053035 A1* 2/2014 Harper ................ G06F 11/3089
714/733

OTHER PUBLICATIONS

William V. Huott et al., "Initializing Scannable and Non-Scannable Latches From a Common Clock Buffer", U.S. Appl. No. 15/245,896, filed Aug. 24, 2016.

* cited by examiner

*Primary Examiner* — Cassandra Cox
(74) *Attorney, Agent, or Firm* — Cantor Colburn LLP; Margaret A. McNamara

(57) ABSTRACT

Aspects include a computer-implemented method for initializing scannable and non-scannable latches from a clock buffer. The method includes receiving a clock signal; receiving control signals including a hold signal, a scan enable signal, and a non-scannable latch force signal; responsive to receiving a low input from the hold signal and the scan enable signal, outputting a high signal from a functional clock port on a next cycle; responsive to receiving a high input from the scan enable signal and a low input from the hold signal, outputting a high slave latch scan clock signal on the next cycle; responsive to receiving a high input from the hold signal and the scan enable signal, outputting a high master latch clock signal on the next clock cycle; and responsive to receiving a high input from the non-scannable latch force signal, outputting a low master latch clock signal on a current cycle.

7 Claims, 5 Drawing Sheets

INITIALIZING SCANNABLE AND NON-SCANNABLE LATCHES FROM A COMMON CLOCK BUFFER

DOMESTIC PRIORITY

This application is a continuation of and claims priority to U.S. Non-provisional application Ser. No. 15/245,896, filed on Aug. 24, 2016, entitled "INITIALIZING SCANNABLE AND NON-SCANNABLE LATCHES FROM A COMMON CLOCK BUFFER," assigned to the assignee hereof and expressly incorporated by reference herein.

BACKGROUND

The present disclosure relates generally to scannable and non-scannable latches, and more specifically, to a method, system, and computer program product for initializing scannable and non-scannable latches from a common clock buffer.

Semiconductor chips containing digital logic contain a variety of sequential memory logic elements that are clocked in local synchronous groups by a controllable local clock buffer circuit. The local clock buffer circuit is connected to a global clock grid or clock tree. Different latch types are clocked by different local clock buffers depending on their type. When new latch types are added to a region on the semiconductor chip, the latches are installed along with a local clock buffer circuit. This additional local clock buffer circuit consumes additional power, occupies additional area, and adds additional capacitive load points to the global clock grid or global clock tree.

SUMMARY

According to embodiments, a system for initializing scannable and non-scannable latches from a common clock buffer is described. The system includes a processor, coupled to a memory, configured to perform a method, the method comprising: receiving a clock signal into a local clock buffer; receiving, at each clock signal, a set of control signals, the set of control signals including a hold control signal, a scan enable control signal, and a non-scannable latch force control signal; responsive to receiving a low input from the hold control signal and the scan enable control signal, outputting a high signal from a functional clock port on the local clock buffer on a next clock cycle; responsive to receiving a high input from the scan enable control signal and a low input from the hold control signal, outputting a high slave latch scan clock signal on the next clock cycle; responsive to receiving a high input from the hold control signal and the scan enable control signal, outputting a high master latch scan clock signal on the next clock cycle; and responsive to receiving a high input from the non-scannable latch force control signal, outputting a low master latch scan clock signal on a current clock cycle.

In accordance with an embodiment of the invention, a method for initializing scannable and non-scannable latches from a common clock buffer is described. The method includes receiving a clock signal into a local clock buffer; receiving, at each clock signal, a set of control signals, the set of control signals including a hold control signal, a scan enable control signal, and a non-scannable latch force control signal; responsive to receiving a low input from the hold control signal and the scan enable control signal, outputting a high signal from a functional clock port on the local clock buffer on a next clock cycle; responsive to receiving a high input from the scan enable control signal and a low input from the hold control signal, outputting a high slave latch scan clock signal on the next clock cycle; responsive to receiving a high input from the hold control signal and the scan enable control signal, outputting a high master latch scan clock signal on the next clock cycle; and responsive to receiving a high input from the non-scannable latch force control signal, outputting a low master latch scan clock signal on a current clock cycle.

In accordance with another embodiment of the invention, a computer program product for clocking scannable and non-scannable latches from a common clock buffer is described. The computer program product comprises a computer readable storage medium having program instructions embodied therewith, the program instructions executable by a processor located on a device to cause the computer processor to perform a method. The method includes receiving a clock signal into a local clock buffer; receiving, at each clock signal, a set of control signals, the set of control signals including a hold control signal, a scan enable control signal, and a non-scannable latch force control signal; responsive to receiving a low input from the hold control signal and the scan enable control signal, outputting a high signal from a functional clock port on the local clock buffer on a next clock cycle; responsive to receiving a high input from the scan enable control signal and a low input from the hold control signal, outputting a high slave latch scan clock signal on the next clock cycle; responsive to receiving a high input from the hold control signal and the scan enable control signal, outputting a high master latch scan clock signal on the next clock cycle; and responsive to receiving a high input from the non-scannable latch force control signal, outputting a low master latch scan clock signal on a current clock cycle.

Additional features and advantages are realized through the techniques of the invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

In accordance with embodiments of the disclosure, a method and apparatus for initializing scannable and non-scannable latches from a common clock buffer is provided. Typically, scannable latches cannot share a local clock buffer with non-scannable latches because the initialization clocks for the non-scannable latches would erase the scan initialization data for the scannable latches. This forces extra initialization local clock buffers and overhead in chip areas where scannable and non-scannable latches are desired. Embodiments described herein include a local clock buffer circuit that receives several control inputs including a hold control signal, a scan enable control signal, and a non-scannable latch force control signal. The local clock buffer is connected to the global or grid clock originating from a computer system. The local clock buffer outputs three clock signals including an L1 latch scan clock, an L2 latch scan clock, and a functional clock. These local clock buffer outputs are coupled to scannable latch clock inputs within the computer system. The scannable latches are configured as a L1 latch and a two-port L2 latch. Additionally, the functional clock output is coupled to the non-scannable latch functional clock port. Based upon the control inputs, the local clock buffer, following the method taught herein, can initialize the scannable latches and fill the non-scannable latches. The non-scannable latch force control signal is inputted into the local clock buffer. The local clock buffer is configured to receive this non-scannable latch force control signal and when the signal is high, this forces the local clock buffer output for the L1 latch scan clock to be low.

Figure 1:
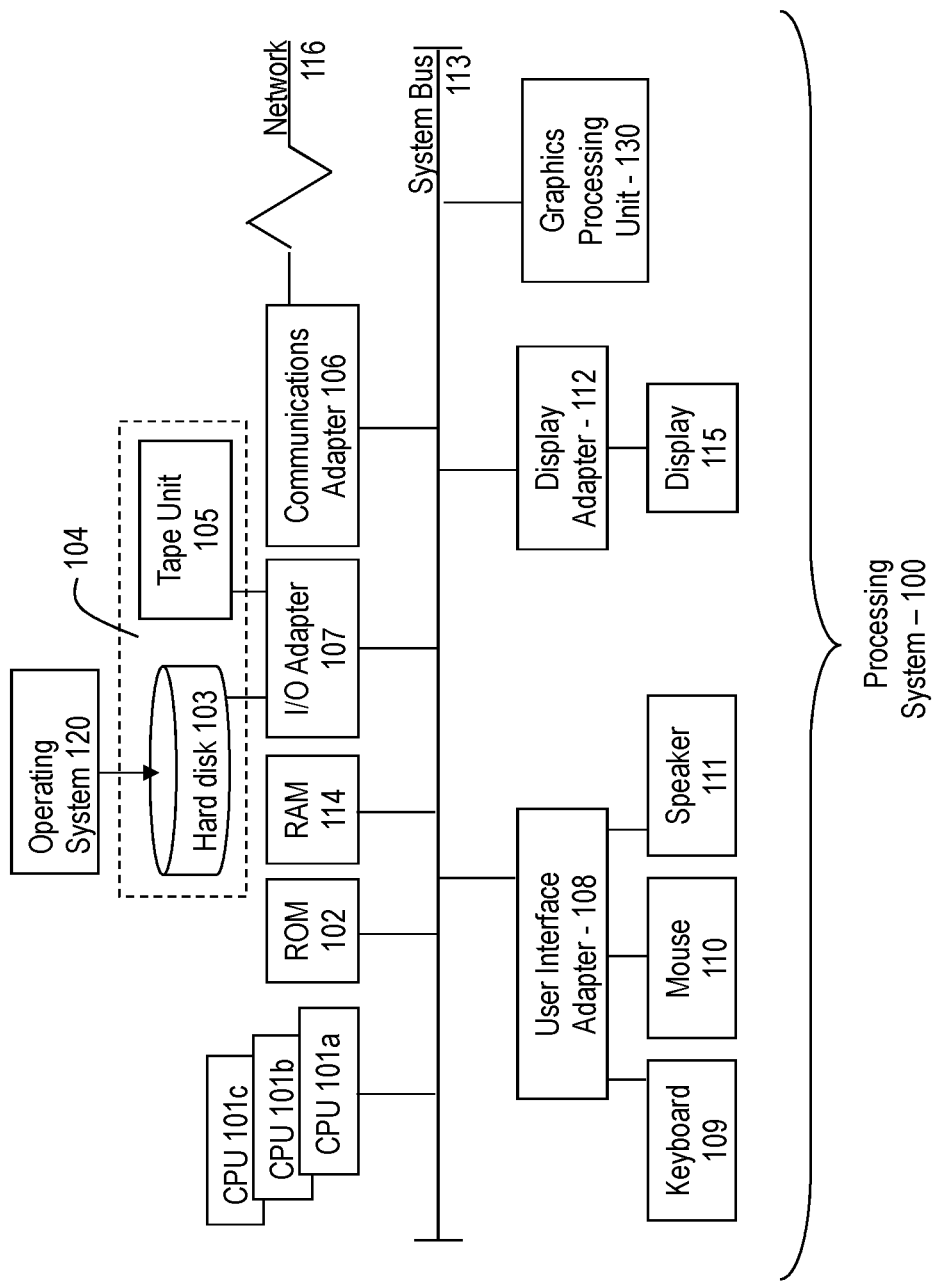
FIG. 1 is a block diagram illustrating one example of a processing system for practice of the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adapter 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1. The system 100 can be implemented in order to perform the testing of various semiconductors and IC devices.

Figure 2:
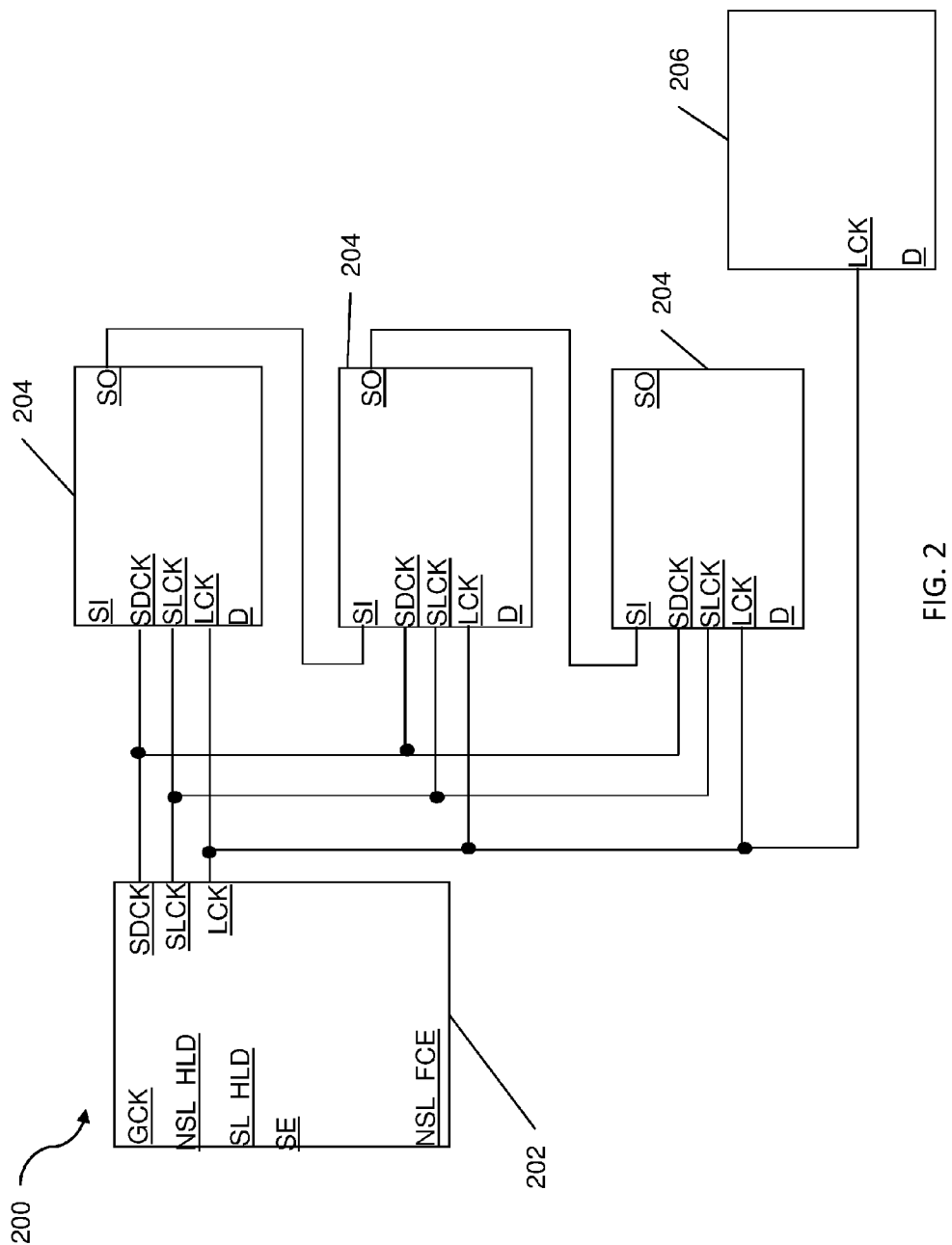
FIG. 2 is a circuit diagram for initializing scannable and non-scannable latches from a common clock buffer in accordance with one or more embodiments.

FIG. 2 illustrates a circuit diagram for initializing scannable and non-scannable latches from a common clock buffer according to an exemplary embodiment. The circuit diagram 200 includes a local clock buffer 202, three electronic scannable latches 204, and a non-scannable latch 206. While only three electronic scannable latches 204 and one non-scannable latch 206 are shown in FIG. 2, in one or more embodiments, any number of combinations of these latch types can be utilized.

In one or more embodiments, the local clock buffer 202 has the following input ports: a global or grid clock port (GCK), a scan enable port (SE), a scan latch hold port (SL_HLD), a non-scan latch hold port (NSL_HLD), and a non-scannable latch force port (NSL_FCE). Each of these ports for the local clock buffer 202 is configured to receive a control signal. In an embodiment, the scannable latch hold port (SL_HLD) and the non-scannable latch hold port (NSL_HLD) are the inputs to an AND gate, so that if either the SL_HLD or the NSL_HLD or both have a low control signal, the resultant would be a low signal. If both the NSL_HLD and SL_HLD receive a high control signal, the resultant would be a high signal. In an embodiment, the NSL_HLD and SL_HLD can be substituted with a hold input signal HLD. In one or more embodiments, the scannable latch hold port (SL_HLD) and the non-scannable latch hold port (NSL_HLD) can be inputs to any number of digital logic gates before inputting into the local clock buffer.

In one or more embodiments, the non-scannable latch force (NSL_FCE) port is configured to receive a non-scannable latch force (NSL_FCE) control signal. The NSL_FCE control signal, when high, will force the L1 scan clock (SDCK) to low. In one or more embodiments, the NSL_FCE port can be inputted into any combination of digital logic gates such as, for example, a two port OR gate where the NSL_FCE control signal is inputted into a first port of the OR gate and the invert of the scan enable (SE) control signal can be inputted into a second port of the OR gate.

In one or more embodiments, the local clock buffer 202 has the following output ports: a function clock port (LCK) and two scan clock ports that output a master latch or L1 latch scan clock signal (SDCK) and a slave latch or L2 latch scan clock signal (SLCK). In the illustrative embodiment, the SDCK and the SLCK ports are coupled to each of the electronic scannable latches 204 at their corresponding SDCK port and SLCK ports. The LCK port for the local clock buffer 202 is coupled to the corresponding LCK ports of both the scannable 204 and non-scannable latch 206 and it drives the functional clock that facilitates the input of functional data into the respective latches. In an embodiment, the electronic scannable latches 204 are configured as a master slave latch or L1 and L2. An illustrative embodiment of the L1 and L2 latches within the scannable latches 204 are described in FIG. 4. The SDCK drives the master or L1 latch and the SLCK drives the slave or L2 latch. In an embodiment, the SDCK and the SLCK are generally orthogonal clocks unless SDCK is forced to a low state or "0" by the combination of control signals NSL_FCE="1" or SE="0".

In one or more embodiments, the global or grid clock input (GCK) is received from a free running clock which inputs into the global clock port (GCK) of the local clock buffer 202. The scan enable port (SE) receives a control signal that will allow for outputting a scan clock signal from either the SDCK or the SLCK ports. For example, when the scannable latches 204 are in scan mode, the scan enable port (SE) will receive a high control signal input which will then allow, subject to the other control signals, for the scan clocks (SDCK and SLCK) to output a high signal. However, if the scan enable port (SE) receives a low control signal input, the scan clocks will be low and the functional clock port (LCK) of the local clock buffer 202 can be enabled, subject to the other control signals, to output a high signal. The scan enable (SE) port allows for a scan data-in operation for the scannable latches 204.

In one or more embodiments, the scannable latches 204 contain a port for each of the three clocks: the scan clock for the master latch (SDCK), the scan clock for the slave latch (SLCK), and the functional clock (LCK). In addition, the scannable latches 204 contain ports for scan-in data (SI) and for function data (D). The scannable latches 204 contain a port for scan-out data (SO). In the illustrative embodiment, the scannable latches 204 are arranged in a scan chain configuration; however, other configurations for the scannable latches may be utilized.

In one or more embodiments, the non-scannable latch 206 contains a port for the functional clock signal (LCK) and a function port (D). The non-scannable latch 206 may be a D-flip flop or any other type of non-scannable latch known in the art.

Figure 3:
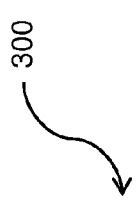
FIG. 3 is a timing diagram illustrating a method for initializing scannable and non-scannable latches from a common clock buffer in accordance with one or more embodiments.

FIG. 3 illustrates a timing diagram illustrating a method for initializing scannable and non-scannable latches from a common clock buffer according to one or more embodiments. The timing diagram includes the GCK 302 which, as mention above, is the free running grid clock. Each letter within the columns following the GCK 302 represents a clock cycle. For example, A represents one clock cycle while B would represent the following clock cycle and so on and so forth. Next, the NSL_HLD 304 which, as mention above, is the non-scannable latch hold control signal and the following columns represent its state at each clock cycle. The remaining control signals are the SL_HLD 306 (scannable latch hold), the SE 308 (scan enable), and the NSL_FCE 310 (non-scannable latch force). The timing diagram 300 illustrates three outputs for the local clock buffer 202 which include the LCK 312 which, as mention above, is the functional clock output, the SDCK 314 (master latch or L1 scan clock output), and the SLCK 316 (slave latch or L2 scan clock output).

In one or more embodiments, the scan initialization begins at clock cycle A and completes at clock cycle X. The timing diagram shows a scan initialization for the three scannable latches 204 and the one non-scannable latch 206 from FIG. 2. As shown in clock cycle A, the scan clock for the master or L1 latch (SDCK) 312 has a high output which drives the scan clock for the master or L1 latch of the first in the series of scannable latches 204 from FIG. 2. While the SDCK 312 is high, scan data is inputted into the L1 latch of the first in the series of scannable latches 204. On the third clock cycle, cycle C, the SL_HLD 306 (scan latch hold input) drops to a low input. On the following clock cycle, cycle D, the scan clock for the slave or L2 latch 316 (SLCK) goes high. On cycle D, the SLCK goes high and the scan data from the L1 latch transfers to the L2 latch which is referred to as a scan operation. At clock cycle D, the scan operation has been performed for the first in the series of three scannable latches as illustrated in FIG. 2. While only three scannable latches 204 are displayed in FIG. 2, more or less than three can be utilized for the practicing of the invention herein.

In one or more embodiments, the scan operation from clock cycles A-D is repeated for the next four clock cycles where the SLCK goes high again on cycle H. When the SLCK goes high on cycle H, the scan data is inputted into the L2 latch of the second in the series of three scannable latches. On the next clock cycle, cycle I, the SDCK is high for two more cycles; however, at clock cycle K, the non-scan latch force control signal (NSL_FCE) 310 goes high and the SDCK goes low on the same clock cycle K. At the same time, on clock cycle K, the SL_HLD 306 goes low allowing for the SLCK to go high on the next clock cycle, cycle L, for the last scan operation for the three scannable latches 204. The NSL_FCE port on the local clock buffer 202 is configured to receive a control signal wherein if the control signal is high, it forces the SDCK 314 output to be low and overrides the other control signals to cause the SDCK 314 output to be low. When the NSL_FCE 310 control signal is low, it no longer forces the SDCK 314 output to be low and the SDCK 314 output is controlled by the other control signals for the local clock buffer 202.

In one or more embodiment, the non-scannable latch fill operation for the non-scannable latch 206 is performed on clock cycle P in the timing diagram 300. Beginning with clock cycle K, the scan clock for the L1 or master latch 314 (SDCK) is forced to low, while the NSL_FCE 310 is high. While the SDCK 314 is low, scan data is held in the master or L1 latch. The final scan operation is performed when the SL_HLD 306 goes low and the following clock cycle, cycle L, the slave or L2 latch scans in the scan data. On clock cycle N, the scan enable (SE) 308 control signal goes low. While the scan enable (SE) 308 is low, the NSL_HLD 304 (non-scan latch hold) control signal goes low, on Cycle O, which allows for the functional clock output 312 (LCK) to go high on the next clock cycle, cycle P. With the functional clock 312 high, the scan data held in the L2 latch of each of the scannable latches 204 is destroyed. However, the master or L1 latch scan clock (SDCK) 314 has remained low allowing the scan data in the master or L1 latch to be preserved. Next, the scan enable (SE) 308 goes high on clock cycle R. The SDCK 314 remains low and, at cycle S, the non-scannable latch hold (NSL_HLD) 304 goes low which allows the slave or L2 latch scan clock (SLCK) 316 to go high on the next clock cycle, cycle T. In one or more embodiments, the NSL_HLD is dropped to a low state at clock cycle O instead of the SL_HLD to avoid firing a clock signal from other local clock buffers that are coupled to and drive only scannable latches and are not needed to fire. When the SLCK 316 goes high on cycle T, the scan data that was preserved in each of the master or L1 latches is scanned back into each of the slave or L2 latches. Next, at clock cycle U, the NSL_FCE 310 goes back to a low state thus allowing the SDCK to go back to a high state.

In the illustrative embodiment, the scan operation occurs every fourth clock cycle as shown in the timing diagram 300. However, the scan operation can occur on any number of clock cycles. For example, the scan operation can occur every second clock cycle or every eighth clock cycle.

Figure 4:
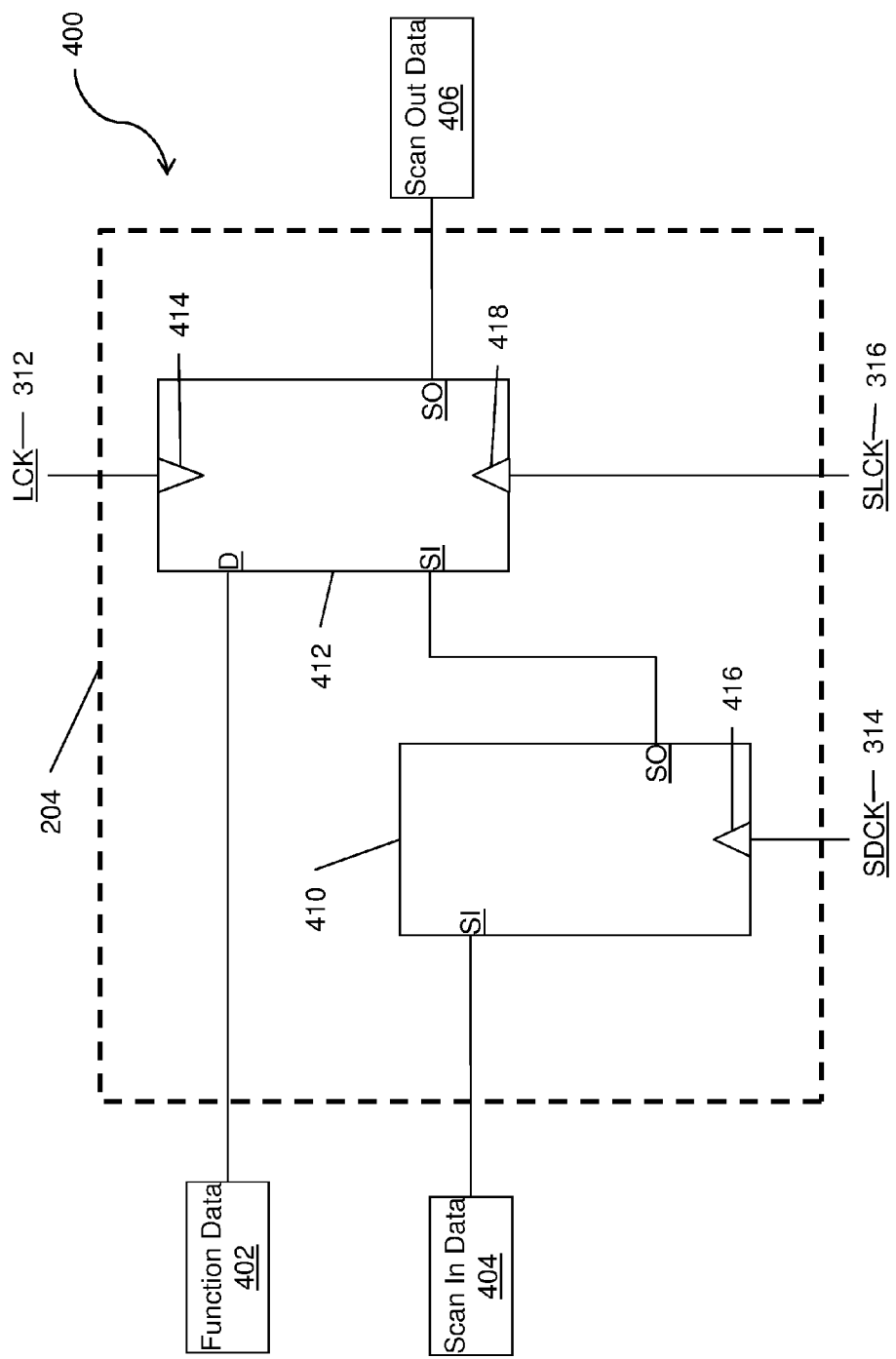
FIG. 4 is a block diagram of an electronic scannable latch in accordance with one or more embodiments.

FIG. 4 illustrates a block diagram of an electronic scannable latch according to one or more embodiments. The scannable latch 204 contains a master or L1 latch 410 and a slave or L2 latch 412. Master latch and L1 latch can be used interchangeably. In addition, slave latch and L2 latch can be used interchangeably herein. The L1 latch 410 is a one-port latch that is configured to receive scan-in data 404 into its scan in port (SI). The L1 latch is driven by the L1 latch scan clock (SDCK) 314. The L1 latch 410 has a clock port 416 which is configured to receive the L1 latch scan clock signal (SDCK) 314. The L1 latch 410 contains a scan out port (SO) which is coupled to the scan in port (SI) of the L2 latch 412. The L2 latch is a two-port latch containing a scan-in port (SI) and a function data port (D). These ports are configured to receive scan-out data from the L1 and function data 402. The L2 has two clock ports: a L2 latch scan clock port 418 and a functional clock port 414. These ports are configured to receive the L2 latch scan clock signal 316 and the functional clock signal 312. The L2 latch 412 contains a scan out port (SO) which is configured to output scan out data 406. The SDCK 314, SLCK 316, and the LCK 312 input signals are received from the respective output ports of the local clock buffer 202.

Referring back to the timing diagram 300 of FIG. 3, the SDCK 314 is high for the first three clock cycles (cycles A-C) which inputs the scan-in data 404 into the L1 latch 410. The SLCK 316 goes high on clock cycle D, which pushes the scan data from the L1 latch 410 into the L2 latch 412. As shown in FIG. 2, there are three scannable latches 204 serially coupled to each other. For scanning the scan-in data 404 into the remaining scannable latches, the next four clock cycles (cycles E-H) repeat the previous four cycles (cycles A-D). On the following four clock cycles (cycles I-L), as previously mentioned above, the NSL_FCE 310 goes high forcing the SDCK 314 to go low on Cycle K. The final or third scannable latch 204 still performs a scan at clock cycle L so the L2 latch of each of the scannable latches receives the scan data. However, since the SDCK 314 remains low starting at clock cycle K, the scan data is preserved in the L1 latch. Later, at clock cycle P, the functional clock (LCK) 312 goes high and destroys the scan data contained within the L2 latch. The functional clock 312 goes high to do a non-scannable latch fill for the non-scannable latch 206. Next, while keeping the SDCK 314 low, the SLCK 316 goes high on clock cycle T and the scan data preserved in the L1 latch 410 is then scanned into the L2 latch 412 for each of the scannable latches. With the scan data scanned into the L2 at clock cycle T and the non-scannable latch fill performed when the functional clock (LCK) 312 goes high at clock cycle P, the initialization of the scannable latches and a non-scannable latch fill operation is achieved utilizing one local clock buffer 202.

While the illustrative embodiments depicts an L1/L2* configuration of a master slave scannable latch, one of skill in the art can appreciate that multiple scannable latch configuration may be used for the teachings herein including other master slave configurations and the like.

In one or more embodiments, the GCK 302 originates from a clock generator which can be any of a single-phase clock, two-phase clock, four phase clock, clock multiplier or the like.

In the illustrated embodiment, the circuit diagram 200 is arranged in a configuration that is serial-in/serial-out. However, in one or more embodiments, the circuit diagram 200 may be arranged in a configuration that is parallel-in/serial-out, serial-in/parallel-out, parallel-in/parallel-out, and also configured as a ring counter.

Figure 5:
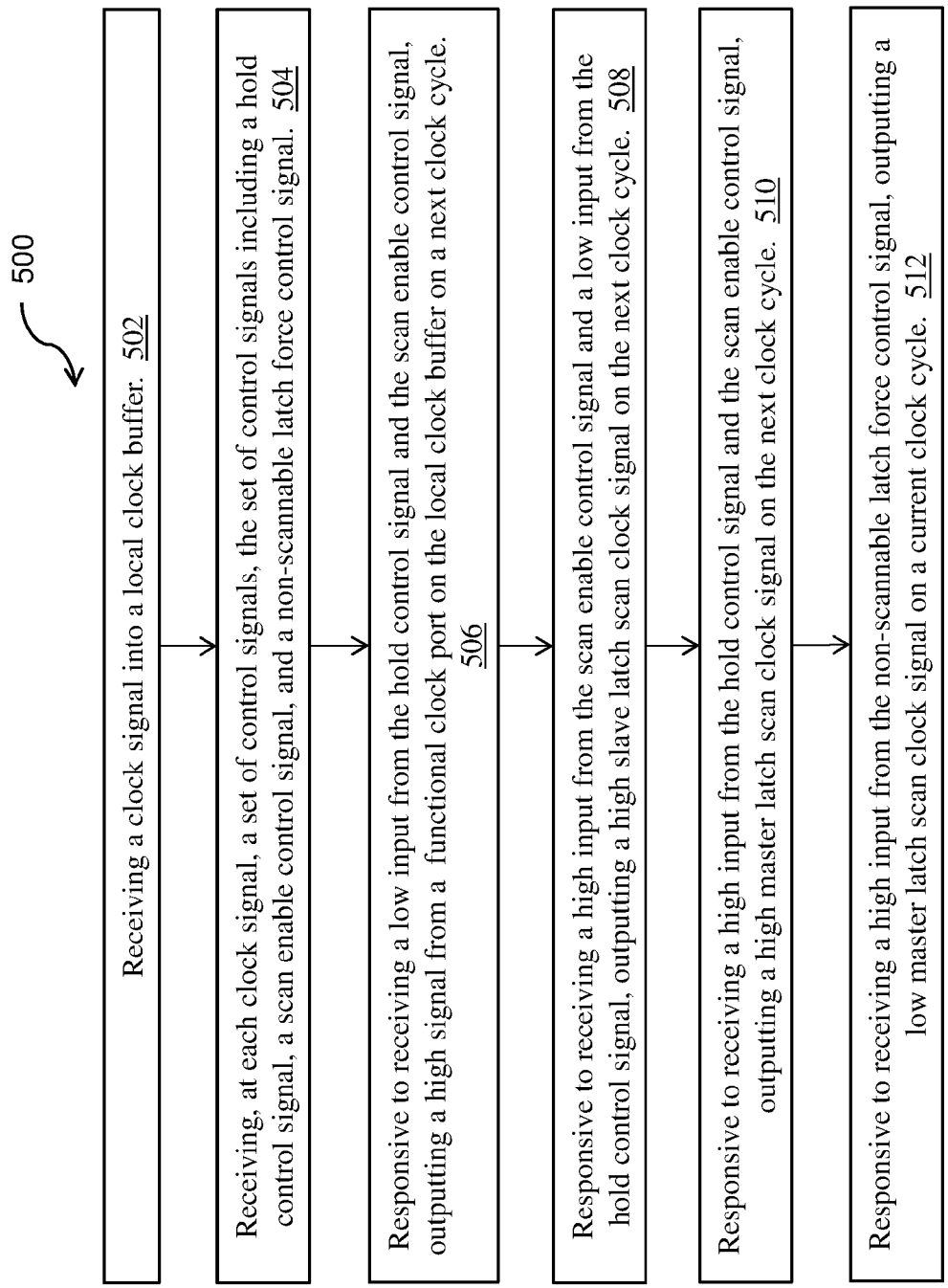
FIG. 5 is a block diagram of a method for initializing scannable and non-scannable latches from a common clock buffer according to one or more embodiments.

FIG. 5 illustrates a block diagram of a method for initializing scannable and non-scannable latches from a common clock buffer according to one or more embodiments. The method 500 includes receiving a clock signal into a local clock buffer, as shown at block 502. Next, at block 504, the method 500 includes receiving, at each clock signal, a set of control signals, the set of control signals including a hold control signal, a scan enable control signal, and a non-scannable latch force control signal. The method 500 next includes responsive to receiving a low input from the hold control signal and the scan enable control signal, outputting a high signal from a functional clock port on the local clock buffer on a next clock cycle, as shown at block 506. Next, at block 508, the method 500 includes responsive to receiving a high input from the scan enable control signal and a low input from the hold control signal, outputting a high slave latch scan clock signal on the next clock cycle. At block 510, the method 500 includes responsive to receiving a high input from the hold control signal and the scan enable control signal, outputting a high master latch scan clock signal on the next clock cycle. Next, at block 512, the method 500 includes responsive to receiving a high input from the non-scannable latch force control signal, outputting a low master latch scan clock signal on a current clock cycle.

Additional processes may also be included. It should be understood that the processes depicted in FIG. 5 represent illustrations, and that other processes may be added or existing processes may be removed, modified, or rearranged without departing from the scope and spirit of the present disclosure.

Technical effects and benefits include a local clock buffer coupled to both scannable and non-scannable latches without the need for separate buffers for each latch type. Most often, different latch types are clocked by different local clock buffers depending on their type, especially for non-scannable and scannable latch types. Removing an extra local clock buffer eliminates the additional power, the additional chip area, and the additional capacitive load points the extra local clock buffer would need. Also, this eliminates the increased work effort, the higher power dissipation, the increased chip area, and the less efficient clock connections across the chip that would normally be present with the extra clock buffer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed:

1. A computer implemented method for initializing scannable and non-scannable latches from a common clock driver, the method comprising:
    receiving a clock signal into a local clock buffer;
    receiving, at each clock signal, a set of control signals including a hold control signal, a scan enable control signal, and a non-scannable latch force control signal;
    responsive to receiving a low input from the hold control signal and the scan enable control signal, outputting a high signal from a functional clock port on the local clock buffer on a next clock cycle;
    responsive to receiving a high input from the scan enable control signal and a low input from the hold control signal, outputting a high slave latch scan clock signal on the next clock cycle;
    responsive to receiving a high input from the hold control signal and the scan enable control signal, outputting a high master latch scan clock signal on the next clock cycle; and responsive to receiving a high input from the non-scannable latch force control signal, outputting a low master latch scan clock signal on a current clock cycle.

2. The method of claim 1, wherein the local clock buffer is coupled to one or more scannable latches and at least one non-scannable latch.

3. The method of claim 1, wherein the hold control signal comprises:
   a non-scannable latch hold control signal and a scannable latch hold control signal passing through one or more digital logic gates.

4. The method of claim 3, wherein the one or more digital logic gates is a two input AND logic gate with the non-scannable latch hold control signal as a first input and the scannable latch hold control signal as a second input.

5. The method of claim 1, wherein the non-scannable latch force control signal passes through one or more digital logic gates within the local clock buffer.

6. The method of claim 5, wherein the one or more digital logic gates is an OR gate with the non-scannable latch force control signal as a first input and an invert of the scan enable control signal as a second input.

7. The method of claim 2, wherein the one or more scannable latches are master-slave latches comprising a one port master latch and a two port slave latch.

* * * * *